United States Patent
Ikeda et al.

(10) Patent No.: US 7,064,589 B2
(45) Date of Patent: Jun. 20, 2006

(54) SEMICONDUCTOR DEVICE USING TWO TYPES OF POWER SUPPLIES SUPPLYING DIFFERENT POTENTIALS

(75) Inventors: Toshimi Ikeda, Kawasaki (JP); Kuninori Kawabata, Kawasaki (JP); Shuzo Otsuka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/075,736

(22) Filed: Mar. 10, 2005

(65) Prior Publication Data
US 2005/0152207 A1 Jul. 14, 2005

Related U.S. Application Data

(63) Continuation of application No. PCT/JP03/05204, filed on Apr. 23, 2003.

(51) Int. Cl.
*H03K 3/00* (2006.01)
*G11C 11/34* (2006.01)
*G11C 16/04* (2006.01)
*G11C 5/14* (2006.01)

(52) U.S. Cl. .................. 327/112; 327/333; 365/185.23; 365/189.11; 365/227

(58) Field of Classification Search ...................... None
See application file for complete search history.

(56) References Cited

U.S. PATENT DOCUMENTS

| 5,398,207 A | | 3/1995 | Tsuchida et al. ............. 365/226 |
| 5,490,119 A | * | 2/1996 | Sakurai et al. ......... 365/230.08 |
| 5,930,170 A | * | 7/1999 | Kunst et al. ............ 365/185.18 |
| 6,031,779 A | | 2/2000 | Takahashi et al. .......... 365/226 |
| 6,292,424 B1 | * | 9/2001 | Ohsawa ...................... 365/226 |

FOREIGN PATENT DOCUMENTS

| JP | 05334875 A | 12/1993 |
| JP | 10284705 A | 10/1998 |
| JP | 200090663 A | 3/2000 |

* cited by examiner

*Primary Examiner*—Tuan T. Lam
(74) *Attorney, Agent, or Firm*—Arent Fox PLLC

(57) ABSTRACT

A semiconductor device which is driven by a first potential, a second potential lower than the first potential, and a third potential lower than the second potential includes a first Pch transistor and a first Nch transistor connected in series between the first potential and the third potential, a second Pch transistor having a drain node thereof connected to a gate node of the first Nch transistor, and a second Nch transistor having a source node thereof connected to a source node of the second Pch transistor, wherein the drain node and gate node of the second Nch transistor are fixed to the second potential and the first potential, respectively.

6 Claims, 4 Drawing Sheets

SEMICONDUCTOR DEVICE USING TWO TYPES OF POWER SUPPLIES SUPPLYING DIFFERENT POTENTIALS

CROSS-REFERENCE TO RELATED APPLICATION

This is a continuation of International Application No. PCT/JP2003/005204, filed on Apr. 23, 2003, the entire contents of which are hereby incorporated by reference.

BACKGROUND OF THE INVENTION

1. Field of the Invention

The present invention generally relates to semiconductor devices, and particularly relates to a semiconductor device which uses two types of power supplies supplying different potentials.

2. Description of the Related Art

In some cases, a semiconductor device uses two types of different power supply potentials. In semiconductor memory devices, for example, a boosted potential higher than the HIGH level needs to be supplied to a word line in order to store the HIGH level in memory cells reliably at high speed. To this end, a booster circuit is used to boost the power supply voltage to generate a higher power supply potential.

FIG. 1 is a circuit diagram showing an example of the configuration of a word-line selecting circuit conforming to a hierarchical word-line structure.

FIG. 1 includes a word drive circuit 10, a main word decoder 11, and a plurality of sub-word decoders 12.

The main word decoder 11 receives an address signal, and decodes the address signal to select a main word line MWL corresponding to the selected word address. In the main word decoder 11 shown in FIG. 1, a circuit portion for implementing the decoder function is not illustrated, and only a circuit portion for driving the selected main word line MWL is shown. In this drive circuit, a Pch transistor 25 and an Nch transistor 26 become non-conductive and conductive, respectively, in response to the selection of the main word line MWL. As a result, the main word line MWL is changed to LOW.

The main word line MWL is connected to the plurality of sub-word decoders 12. The word drive circuit 10 selects one of the sub-word decoders 12 based on the address signal, and drives the selected sub-word decoder 12. In the word drive circuit 10 shown in FIG. 1, only a circuit portion for driving the selected sub-word decoder 12 is shown. With respect to the selected sub-word decoder 12, a Pch transistor 21 and an Nch transistor 23 of the word drive circuit 10 are tuned off and on, respectively, thereby changing a word-line-unselected-case clamping signal WDRVB to LOW. Further, a Pch transistor 22 and an Nch transistor 24 are tuned on and off, respectively, thereby changing a word-line-HIGH power supply WDRV to HIGH.

In the sub-word decoders 12, the change of the main word line MWL to LOW causes a Pch transistor 27 and an Nch transistor 28 to be tuned on and off, respectively. Because of this, as the word-line-HIGH power supply WDRV changes to HIGH, this HIGH potential is transmitted to a sub-word line SWL as a selected word line signal. At this time, also, the word-line-unselected-case clamping signal WDRVB is LOW, so that an Nch transistor 29 is nonconductive.

In a sub-word decoders 12 that is unselected, the word-line-unselected-case clamping signal WDRVB supplied from the word drive circuit 10 is set to HIGH in order to prevent the sub-word line SWL from being placed in the floating state. As a result, the Nch transistor 29 becomes conductive, thereby clamping the sub-word line SWL to a substrate potential Vss during the time of an unselected state.

FIG. 2 is a circuit diagram showing an example of the construction of the main word decoder 11.

The main word decoder 11 of FIG. 2 includes Pch transistors 31 through 37 and Nch transistors 38 thourgh 46. The Nch transistors 38 through 40 constitute an address decoding portion, by which the main word line MWL is selected in response to address signals Add1 through Add3 being all HIGH. Upon selection, a latch, which is formed by an inverter comprised of the Pch transistor 32 and the Nch transistor 41 and an inverter comprised of the Pch transistor 36 and the Nch transistor 44, is set in the state in which its input and output become LOW and HIGH, respectively. This state will be maintained until a reset signal RST is changed to LOW for resetting.

As the latch is reset, the gate of the Pch transistor 35 and the gate of the Nch transistor 46 receive HIGH. As a result, the main word line MWL is placed in the selected state (LOW).

As shown in FIG. 1 and FIG. 2, a boosted potential Vpp is supplied to the source node of each Pch transistor of the word drive circuit 10 and to the source node of each Pch transistor of the main word decoder 11. The boosted potential Vpp is obtained by use of an internal booster circuit for boosting a power supply potential Vdd supplied to the semiconductor memory device.

In recent years, battery-driven apparatus such as cellular phones and personal digital assistants have been requiring semiconductor devices having large-scale and complex circuits in order to provide various sophisticated functions. As the circuit size increases, however, the power consumption of the semiconductor device undesirably increases. Not only in the field of mobile apparatus but also in the field of computers or the like, there is a strong demand for lower power consumption. Lowering power consumption in semiconductor devices is thus an indispensable technology.

In semiconductor memory devices, especially, a boosted power supply generated by a booster circuit is used for the circuits for word-line selection and the like as described above, and the power consumption is larger when the boosted potential is used than when the normal power supply potential is used. For the purpose of reduction of power consumption, thus, it is desirable to keep the circuit portion using the boosted power supply to a necessary minimum. With respect to semiconductor devices in general not limited to the semiconductor memory devices, it is desirable, from the viewpoint of reduction of power consumption, to keep the circuit portion using a higher-potential power supply to a necessary minimum when two types of power supplies are used, not only in the case of the use of a boosted power supply.

Accordingly, there is a need to reduce power consumption in the semiconductor device that uses two types of power supplies supplying different potentials.

SUMMARY OF THE INVENTION

It is a general object of the present invention to provide a semiconductor device that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a semiconductor device particularly pointed out in the specification in such full, clear, concise, and exact terms as to enable a person having ordinary skill in the art to practice the invention.

To achieve these and other advantages in accordance with the purpose of the invention, the invention provides a semiconductor device driven by a first potential, a second potential lower than the first potential, and a third potential lower than the second potential, which includes a first Pch transistor and a first Nch transistor connected in series between the first potential and the third potential, a second Pch transistor having a drain node thereof connected to a gate node of the first Nch transistor, and a second Nch transistor having a source node thereof connected to a source node of the second Pch transistor, wherein the drain node and gate node of the second Nch transistor are fixed to the second potential and the first potential, respectively.

According to at least one embodiment of the present invention, provision is made such that a series connection of a Pch transistor and an Nch transistor is provided between the particularly high potential and the ground potential, and the gate node of the Nch transistor connected to the ground receives a normal power supply potential rather than the particularly high potential. In this configuration, further, an Nch transistor having the gate thereof receiving the particularly high potential is inserted between the normal power supply potential and the source node of a Pch transistor for supplying the normal power supply potential. With this provision, it is possible to reduce power consumption by decreasing the circuit portion that uses the particularly high potential, and it is also possible to prevent a through current, thereby achieving the reduction of power consumption and stable operations.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

Figure 1:
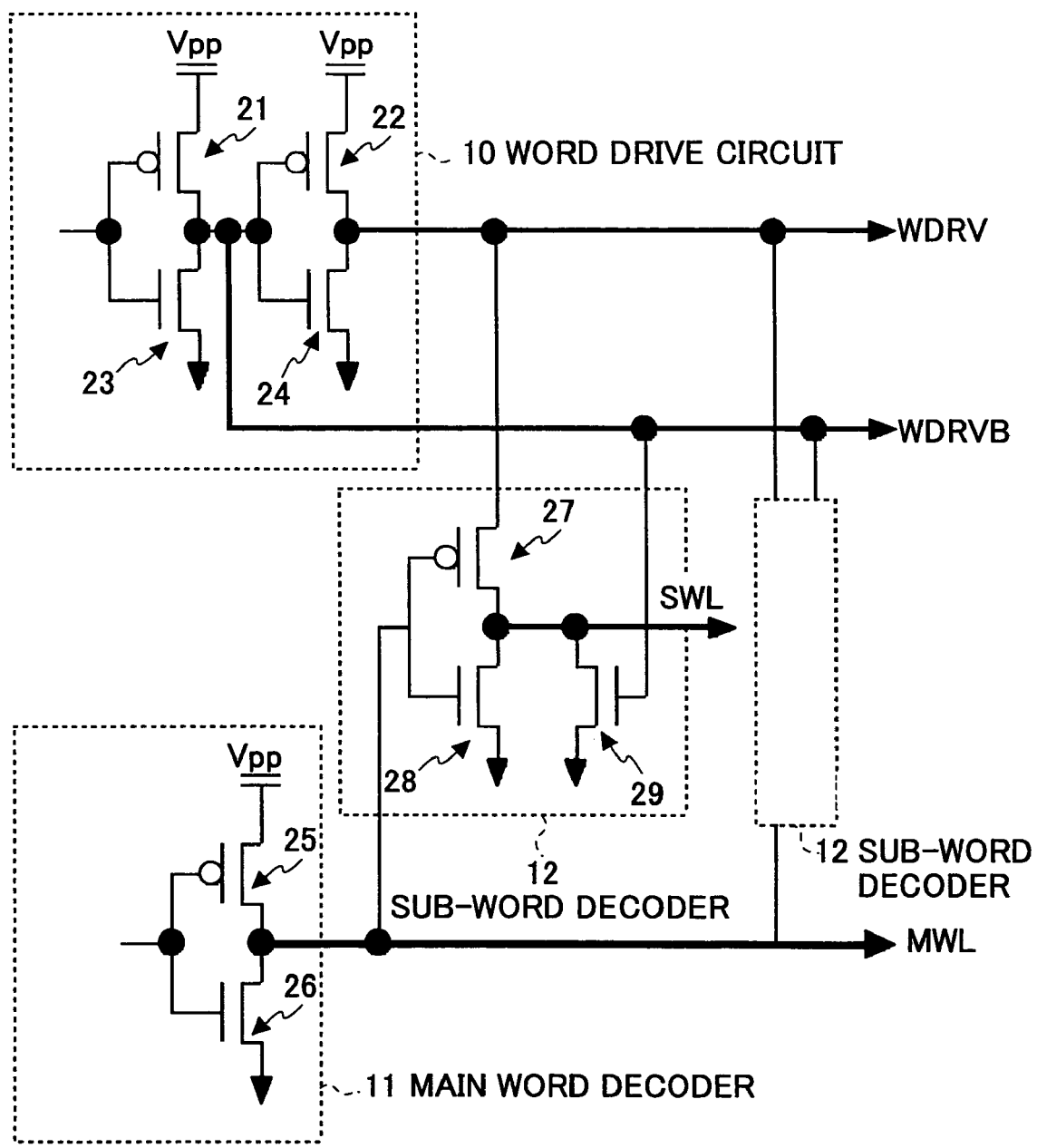
FIG. 1 is a circuit diagram showing an example of the configuration of a word-line selecting circuit conforming to a hierarchical word-line structure.

In the following, embodiments of the present invention will be described with reference to the accompanying drawings.

In the circuit that uses a particularly high potential such as a boosted potential (i.e., the circuits shown in FIG. 1 or FIG. 2), a series connection of a Pch transistor and an Nch transistor may be provided between the particularly high potential and the ground potential. In such a case, the gate node of the Nch transistor connected to the ground does not need to receive the particularly high potential, but may only need a normal power supply potential. This is because a potential higher than the threshold potential Vth of the Nch transistor suffices to turn on the Nch transistor. An example of such Nch transistor is the Nch transistor 46 shown in FIG. 2.

A simple, straightforward modification that changes the HIGH-side potential (e.g., the source potential of the Pch transistor 37 of FIG. 2) supplied to the gate of such Nch transistor to the power supply potential Vii may result in the problem as follows. The particularly high potential may drop for some reason, and may become a potential lower than the power supply potential Vii. The Pch transistor (Pch transistor 37 of FIG. 2) supplying the HIGH-side potential receives the particularly high potential at its gate (i.e., the boosted potential Vpp in FIG. 2). If the particularly high potential supplied to the gate drops below the power supply potential Vii supplied to the source, this Pch transistor cannot be sufficiently turned off when a complete non-conductive state is required. In the construction shown in FIG. 2, thus, a through current flows from the Pch transistor 37 to the Nch transistor 45, resulting in an increase of current consumption. Also, the presence of the through current further exacerbates the potential drop.

When the boosted potential generated by the booster circuit is used in the word line selecting circuit, an operation that consumes the boosted potential more than usual as in the case of a word line multiple selection test may result in a situation in which the capacity of the booster circuit cannot keep up with the consumption of power. In such a case, the boosted potential may temporarily drop below the power supply potential Vii, which causes the through current to flow as described above. Further, the presence of the through current makes it difficult to return the output of the booster circuit to the high potential, creating a risk that the through current may continue to flow.

In order to obviate those problems, the present invention uses the configuration in which not only the HIGH potential supplied to the gate of the Nch transistor is set to the normal power supply potential, but also an Nch transistor having the gate thereof receiving the particularly high potential is inserted between the source node of the Pch transistor supplying this HIGH potential and the power supply potential. With this configuration, a drop in the particularly high potential Vpp below the power supply voltage does not cause the Pch transistor to become conductive because the potential at the source node of the Pch transistor is Vpp−ΔVth. This prevents a through current from flowing.

Figure 3:
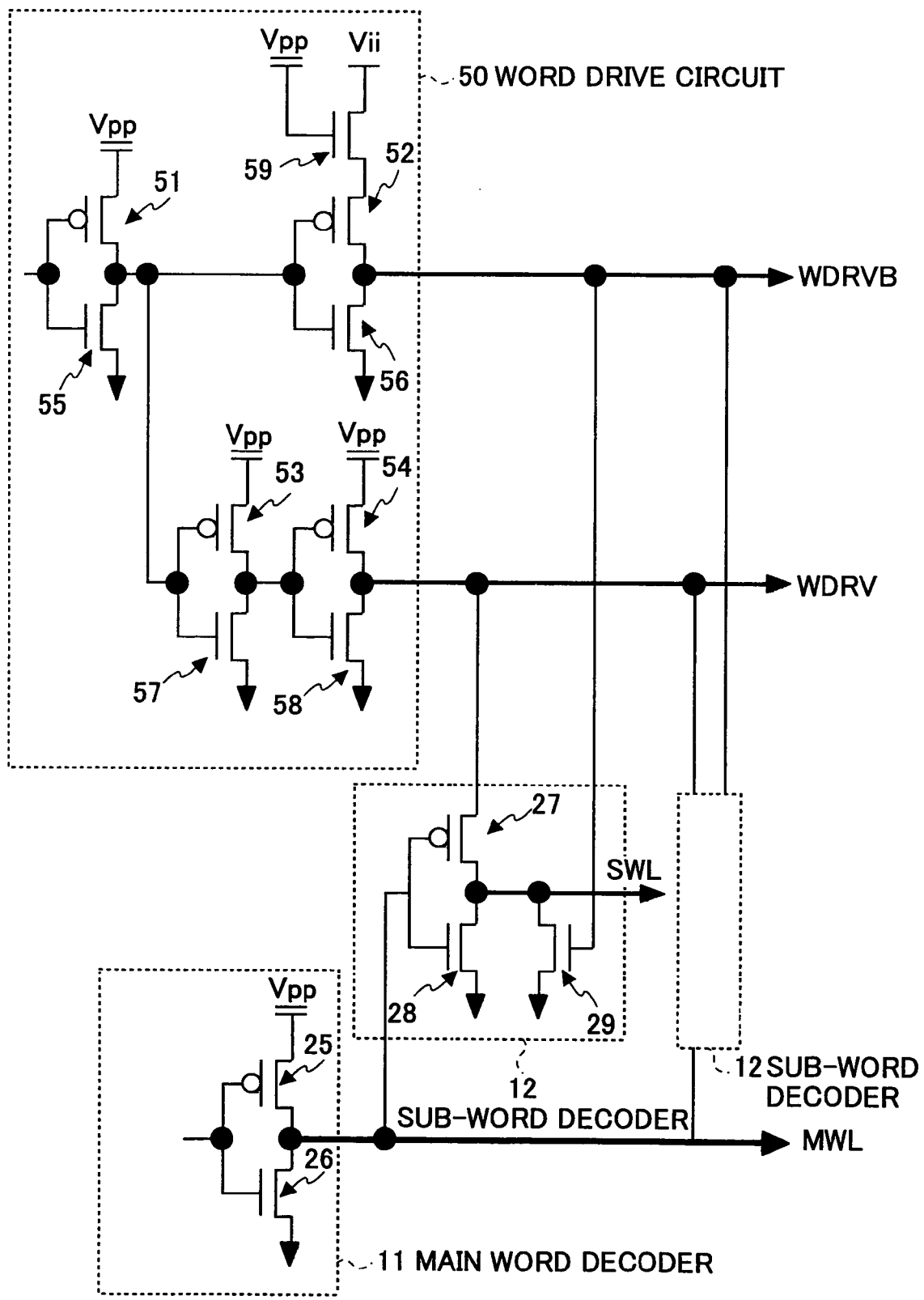
FIG. 3 is a circuit diagram showing an example of an embodiment according to the present invention.

FIG. 3 is a circuit diagram showing an example of an embodiment according to the present invention. FIG. 3 corresponds to FIG. 1, and shows a circuit diagram illustrating an example of the construction of a word line selecting circuit conforming to a hierarchical word-line structure. In FIG. 3, the same elements as those of FIG. 1 are referred to by the same numerals, and a description thereof will be omitted.

In FIG. 3, a word drive circuit 50 is provided in place of the word drive circuit 10 of FIG. 1. The word drive circuit 50 includes Pch transistors 51 through 54 and Nch transistors 55 through 59. In the related-art word drive circuit 10 shown in FIG. 1, a signal of a stage immediately preceding the stage of the word-line-HIGH power supply WDRV is output as the word-line-unselected-case clamping signal WDRVB. In the word drive circuit 50 of FIG. 3, on the other hand, the word-line-unselected-case clamping signal WDRVB is output from a separate output stage (a Pch transistor 52 and an Nch transistor 56) for which the internal power supply Vii replaces the HIGH potential.

The Pch transistor 27 and Nch transistor 29 of the sub-word decoder 12 are a series connection of a Pch transistor and an Nch transistor provided between the particularly high potential and the ground potential. Because of this, the gate node of the Nch transistor 29 connected to the ground may properly receive a normal power supply potential rather than the particularly high potential. At the output stage (Pch transistor 52 and Nch transistor 56) of the word-line-unselected-case clamping signal WDRVB, therefore, the internal power supply Vii is used as the HIGH-side power supply of the Pch transistor. Here, the LOW-side power supply of the Nch transistor may properly be the substrate potential Vss, or may be a word line potential Vrst lower than the substrate potential Vss. Further, the potential that is applied to the gates of the transistors may also be set to the substrate potential Vss on the LOW side, or may be set to the word line potential Vrst lower than the substrate potential Vss.

Between the source node of the Pch transistor 52 and the power supply Vii at this output stage, an Nch transistor 59 is inserted, with the gate thereof receiving the boosted potential Vpp. Accordingly, even if the boosted potential Vpp drops to a potential lower than the power supply potential Vii, the Pch transistor 52 is not turned on because the potential at the source node of the Pch transistor 52 is set at Vpp−ΔVth. This prevents a through current from flowing.

In this manner, the present invention provides a configuration in which a series connection of a Pch transistor and an Nch transistor is provided between the particularly high potential and the ground potential, and the gate node of the Nch transistor connected to the ground receives a normal power supply potential rather than the particularly high potential. In this configuration, further, an Nch transistor having the gate thereof receiving the particularly high potential is inserted between the normal power supply potential and the source node of a Pch transistor supplying the normal power supply potential. With this provision, it is possible to reduce power consumption by decreasing the circuit portion that uses the particularly high potential, and it is also possible to prevent a through current, thereby achieving the reduction of power consumption and stable operations.

Figure 4:
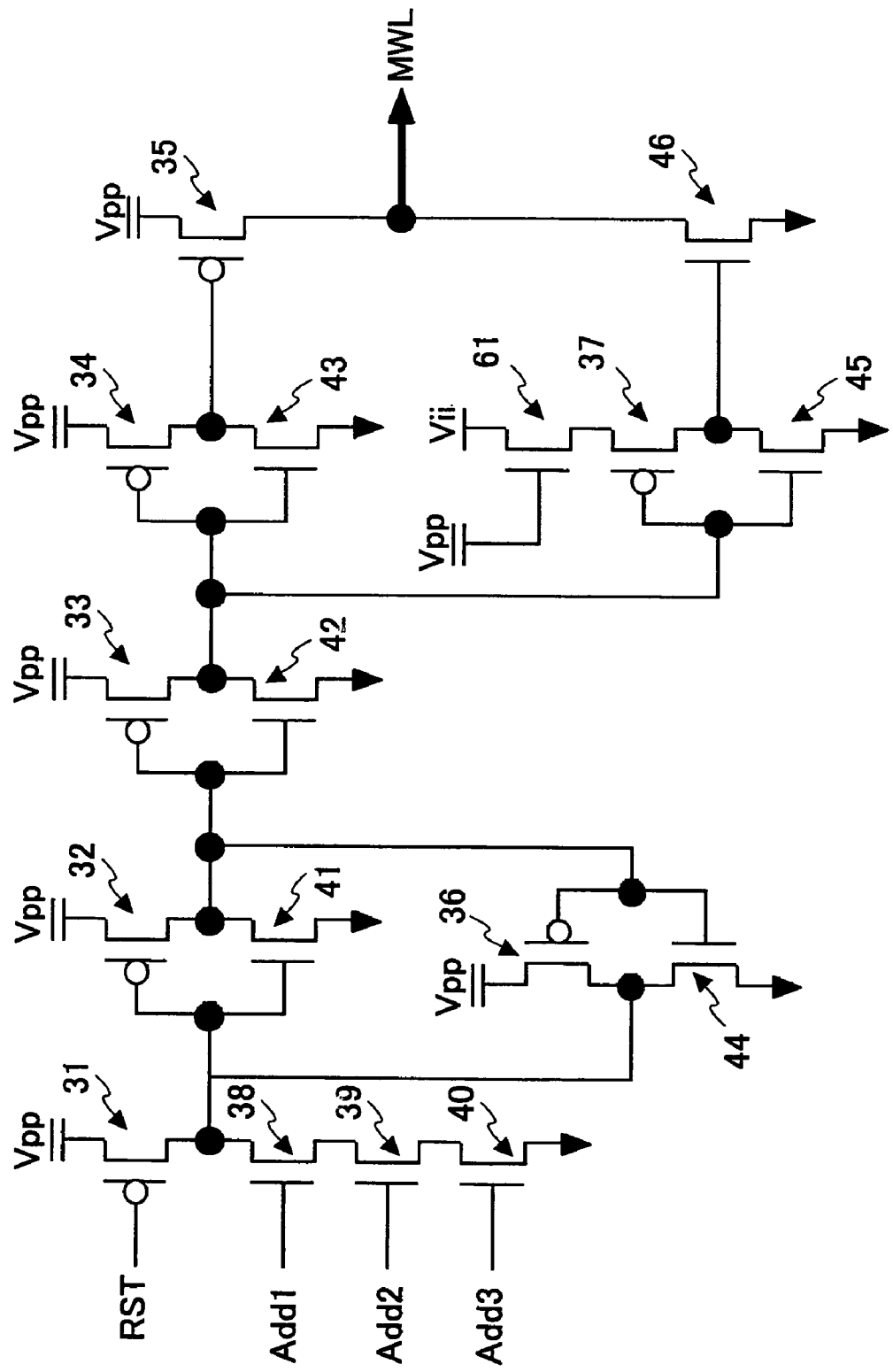
FIG. 4 is a circuit diagram showing an example of another embodiment according to the present invention.

FIG. 4 is a circuit diagram showing an example of another embodiment according to the present invention. FIG. 4 corresponds to FIG. 2, and shows a circuit diagram illustrating an example of the construction of a main word decoder. In FIG. 4, the same elements as those of FIG. 2 are referred to by the same numerals, and a description thereof will be omitted.

Figure 2:
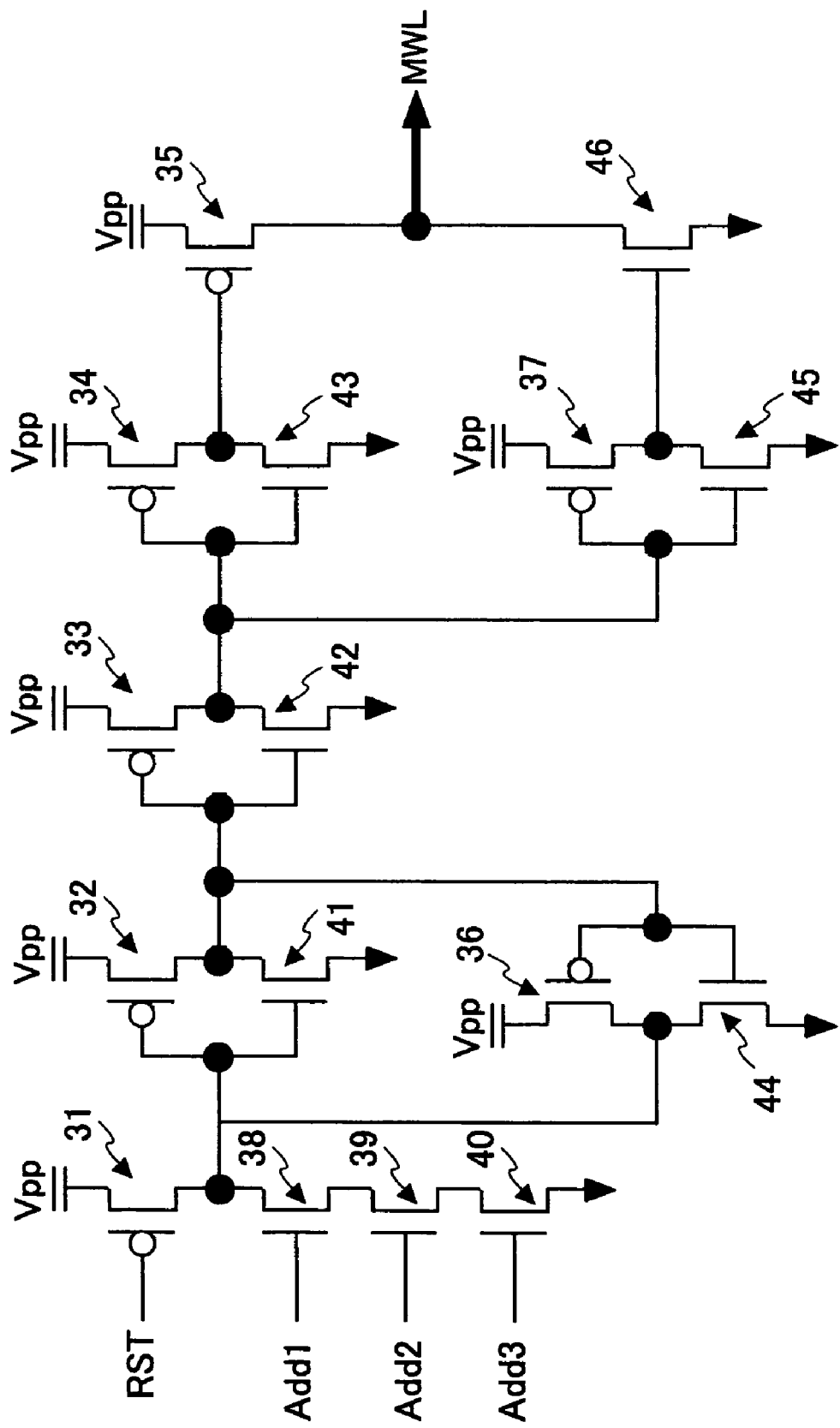
FIG. 2 is a circuit diagram showing an example of the construction of a main word decoder.

In the main word decoder 11 of FIG. 2, the Pch transistor 35 and Nch transistor 46 constituting the output stage are a series connection of a Pch transistor and an Nch transistor provided between the particularly high potential and the ground potential. Because of this, the gate node of the Nch transistor 46 connected to the ground may properly receive a normal power supply potential rather than the particularly high potential. In the embodiment of the present invention shown in FIG. 4, therefore, the input stage (Pch transistor 37 and Nch transistor 45) for the gate of the Nch transistor 46 uses the internal power supply Vii as the HIGH-side power supply of the Pch transistor. Here, the LOW-side power supply of the Nch transistor may properly be the substrate potential Vss, or may be the word line potential Vrst lower than the substrate potential Vss. Further, the potential that is applied to the gates of the transistors may also be set to the substrate potential Vss on the LOW side, or may be set to the word line potential Vrst lower than the substrate potential Vss.

Between the source node of the Pch transistor 37 and the power supply Vii, an Nch transistor 61 is inserted, with the gate thereof receiving the boosted potential Vpp. Accordingly, even if the boosted potential Vpp drops to a potential lower than the power supply potential Vii, the Pch transistor 37 is not turned on because the potential at the source node of the Pch transistor 37 is set at Vpp−ΔVth. This prevents a through current from flowing.

In this manner, the present invention provides a configuration in which a series connection of a Pch transistor and an Nch transistor is provided between the particularly high potential and the ground potential, and the gate node of the Nch transistor connected to the ground receives a normal power supply potential rather than the particularly high potential. In this configuration, further, an Nch transistor having the gate thereof receiving the particularly high potential is inserted between the normal power supply potential and the source node of a Pch transistor for supplying the normal power supply potential. With this provision, it is possible to reduce power consumption by decreasing the circuit portion that uses the particularly high potential, and it is also possible to prevent a through current, thereby achieving the reduction of power consumption and stable operations.

Further, the present invention is not limited to these embodiments, but various variations and modifications may be made without departing from the scope of the present invention.

For example, the above embodiments have been described with reference to a case in which the boosted potential generated by the booster circuit is used in the word line selecting circuit. This is not a limiting example, and the present invention is applicable to semiconductor devices in general that use two types of power supplies for supplying high and low potentials. In the semiconductor devices that use two types of power supplies for supplying high and low potentials, similar problems to those observed with respect to the boosted potential may arise if the power supply capacity is not sufficient due to wire resistance or the like. The application of the present invention makes it possible to reduce power consumption and to stabilize operations.

What is claimed is:

1. A semiconductor device which is driven by a first potential, a second potential lower than the first potential, and a third potential lower than the second potential, comprising:

a first Pch transistor and a first Nch transistor connected in series between the first potential and the third potential;

a second Pch transistor having a drain node thereof connected to a gate node of the first Nch transistor; and a second Nch transistor having a source node thereof connected to a source node of the second Pch transistor, wherein the drain node and gate node of the second Nch transistor are fixed to the second potential and the first potential, respectively.

2. The semiconductor device as claimed in claim 1, wherein the first potential, the second potential, and the third potential are power supply potentials supplied from an exterior of the semiconductor device.

3. The semiconductor device as claimed in claim 1, wherein the first potential is a boosted potential made by boosting the second potential inside the semiconductor device.

4. The semiconductor device as claimed in claim 3, wherein the first and second Pch transistors and the first and second Nch transistors are provided in a word line selecting circuit of a semiconductor memory device.

5. A semiconductor device which is driven by a first potential, a second potential lower than the first potential, and a third potential lower than the second potential, comprising:
- a circuit, including a first Pch transistor and a first Nch transistor connected in series via a joint point, configured to generate one of the first potential and the third potential at the joint point in response to conductive/non-conductive states of the first Pch transistor and the first Nch transistor;
- a second Pch transistor having a drain node thereof connected to a gate node of the first Nch transistor; and
- a second Nch transistor having a source node thereof connected to a source node of the second Pch transistor, wherein the drain node and gate node of the second Nch transistor are fixed to the second potential and the first potential, respectively.

6. The semiconductor device as claimed in claim 5, further includes a third Nch transistor having a drain node thereof connected to the drain node of the second Pch transistor, wherein a source node of the third Nch transistor is fixed to the third potential.

* * * * *